United States Patent
Petladwala et al.

(10) Patent No.: US 11,635,454 B2
(45) Date of Patent: Apr. 25, 2023

(54) MODEL STRUCTURE SELECTION APPARATUS, METHOD, DISAGGREGATION SYSTEM AND PROGRAM

(71) Applicant: NEC Corporation, Tokyo (JP)

(72) Inventors: Murtuza Petladwala, Tokyo (JP); Ryota Suzuki, Tokyo (JP); Shigeru Koumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 588 days.

(21) Appl. No.: 16/635,282

(22) PCT Filed: Aug. 3, 2017

(86) PCT No.: PCT/JP2017/028230
§ 371 (c)(1),
(2) Date: Jan. 30, 2020

(87) PCT Pub. No.: WO2019/026231
PCT Pub. Date: Feb. 7, 2019

(65) Prior Publication Data
US 2021/0097417 A1    Apr. 1, 2021

(51) Int. Cl.
*G01R 19/25* (2006.01)
*G06N 20/00* (2019.01)
*G06K 9/62* (2022.01)
*G06N 7/00* (2006.01)
*G01R 19/02* (2006.01)

(52) U.S. Cl.
CPC ......... *G01R 19/2506* (2013.01); *G01R 19/02* (2013.01); *G06K 9/6298* (2013.01); *G06N 7/005* (2013.01); *G06N 20/00* (2019.01)

(58) Field of Classification Search
CPC .. G01R 19/2506; G01R 19/02; G06K 9/6298; G06N 7/005; G06N 20/00
See application file for complete search history.

(56) References Cited

U.S. PATENT DOCUMENTS

| 2011/0112780 A1 | 5/2011 | Moss |
| 2012/0197560 A1 | 8/2012 | Kuhns et al. |

(Continued)

FOREIGN PATENT DOCUMENTS

| EP | 1296147 A1 | 3/2003 |
| EP | 2573576 A1 | 3/2013 |

(Continued)

OTHER PUBLICATIONS

International Search Report for PCT Application No. PCT/JP2017/028230, dated Oct. 31, 2017.

(Continued)

*Primary Examiner* — Jianxun Yang
(74) *Attorney, Agent, or Firm* — Sughrue Mion, PLLC

(57) ABSTRACT

Provided an apparatus that receives time series data from a data storage unit storing time series of sample data or feature values calculated from the sample data, computes a measure indicating change and repetition characteristics of the time series data, based on sample value distribution thereof, selects a state model structure to be used for model learning and estimation, from state models including a fully connected state model and a one way direction state model, based on the measure and stores the selected state model in a model storage unit.

11 Claims, 11 Drawing Sheets

(56) References Cited

U.S. PATENT DOCUMENTS

| | | | |
|---|---|---|---|
| 2012/0278272 A1 | 11/2012 | Kim et al. | |
| 2015/0046135 A1* | 2/2015 | Ito | G06F 17/10 |
| | | | 703/2 |
| 2016/0349293 A1* | 12/2016 | Chattopadhyay | G01R 21/00 |
| 2019/0012604 A1* | 1/2019 | Hiratsuka | H02J 13/00 |

FOREIGN PATENT DOCUMENTS

| | | |
|---|---|---|
| JP | 2004-287010 A | 10/2004 |
| JP | 2013-210755 A | 10/2013 |
| JP | 2013-213825 A | 10/2013 |
| JP | 2013-218715 A | 10/2013 |
| WO | 2017/057180 A1 | 4/2017 |

OTHER PUBLICATIONS

Written opinion for PCT Application No. PCT/JP2017/028230.
Zoubin Ghahramani, and Michael I. Jordan, 'Factorial Hidden Markov Models', Machine Learning vol. 29, Issue 2-3, Nov./Dec. 1997, Netherlands.

\* cited by examiner

FIG. 2A
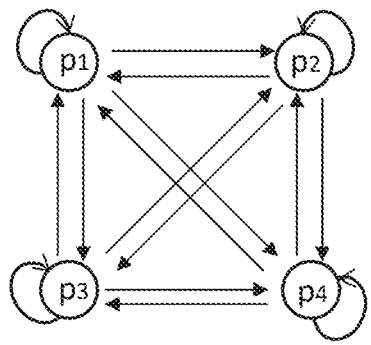
FIG. 2B
$$A = \begin{pmatrix} a_{1,1} & a_{1,2} & a_{1,3} & a_{1,4} \\ a_{2,1} & a_{2,2} & a_{2,3} & a_{2,4} \\ a_{3,1} & a_{3,2} & a_{3,3} & a_{3,4} \\ a_{4,1} & a_{4,2} & a_{4,3} & a_{4,4} \end{pmatrix}$$
FIG. 2C
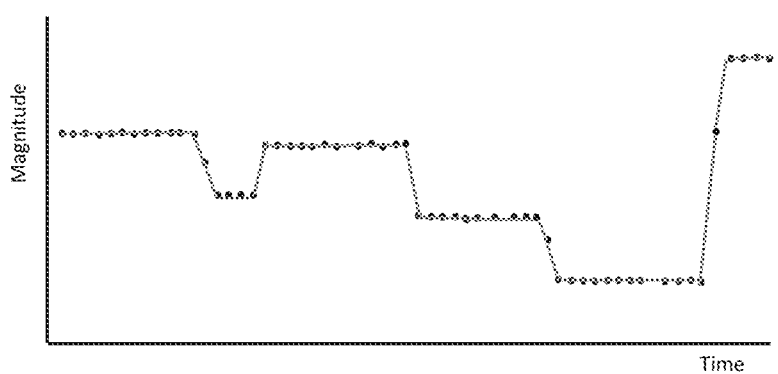

FIG. 3A
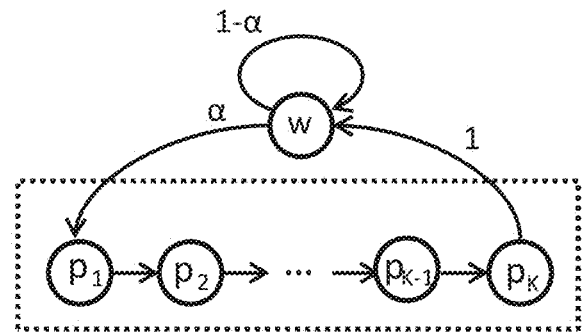
FIG. 3B
$$B = \begin{pmatrix} b_{1,1} & b_{1,2} & b_{1,3} & ... & b_{1,K} \\ b_{2,1} & b_{2,2} & b_{2,3} & ... & b_{2,K} \\ ............................... \\ b_{K-1,1} & b_{K-1,2} & b_{K-1,3} & ... & b_{K-1,K} \\ b_{K,1} & b_{K,2} & b_{K,3} & ... & b_{K,K} \end{pmatrix} = \begin{pmatrix} 0 & 1 & 0 & ... & 0 \\ 0 & 0 & 1 & ... & 0 \\ ............... \\ 0 & 0 & 0 & ... & 1 \\ 0 & 0 & 0 & ... & 0 \end{pmatrix}$$
FIG. 3C
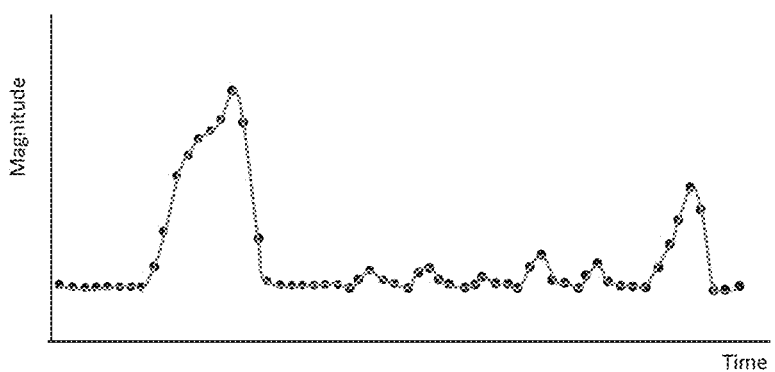

MODEL STRUCTURE SELECTION APPARATUS, METHOD, DISAGGREGATION SYSTEM AND PROGRAM

FIELD

This application is a National Stage Entry of PCT/JP2017/028230 filed on Aug. 3, 2017, the contents of all of which are incorporated herein by reference, in their entirety.

The present invention relates to a model structure selection apparatus, method, disaggregation system and program.

BACKGROUND

Disaggregation technology is used to disaggregate an aggregate (synthetic) signal, such as power or current consumption, of a plurality of appliances into an individual waveform.

As an algorithm for disaggregation, any one of algorithms such as Factorial Hidden Markov Model (FHMM), Combinatorial Optimization, Blind Source Separation and so forth may be utilized.

Graphical state model is a probabilistic model, where a graph denotes a conditional structure between time periods of given data or distribution. Generally, an appliance is likely to remain in a current state thereof and an occurrence of state change is comparatively rare or frequent, depending on an operation type of the appliance, for example.

As one of typical state model structures for modeling transitions among states, there is a fully connected state model wherein all the states are fully connected, i.e., transition from any state to any other state is allowed, and any state could act as a beginning state or an ending state.

In a FHMM based disaggregation approach, such a state model structure with a fixed number of nodes (states) and fixed number of edges is usually adopted. As a simple case of FHMM, one appliance corresponds to one factor, wherein each factor represents a state model structure. FIGS. 10A and 10B respectively illustrate schematically Hidden Markov Model (HMM) and FMMM in terms of relation between observation and states of HMM and FHMM.

Note: regarding disaggregation system using FHMM, reference may be made to Non-Patent Literature 1 (NPTL 1), Patent Literature 1 (PTL 1) and Patent Literature 2 (PTL 2).

In HMM, one state variable $S_t$ (hidden states) at time stamp t, corresponds to observation data $Y_t$ (aggregate waveform data) at time stamp t (See FIG. 10A).

In FHMM, as a state variable $S_t$ at time stamp t, there are a plurality of (M) state variables: $S_t^{(1)}$, $S_t^{(2)}$, $S_t^{(3)}$, ... $S_t^{(m)}$, ..., and $S_t^{(M)}$, and from M number of state variables: $S_t^{(1)}$ to $S_t^{(M)}$ at time stamp t, one observation data $Y_t$ is generated (See FIG. 10B). That is, in FHMM, the observation $Y_t$ at time stamp t, depends on all state variables $S_t^{(1)}$ to $S_t^{(M)}$ at that time stamp.

M number of state variables $S_t^{(1)}$ to $S_t^{(M)}$ may correspond respectively to M number of appliances. The state values of M number of state variables $S_t^{(1)}$ to $S_t^{(M)}$ correspond respectively to states of M number of appliances (operation state, such as, on or off state). That is, a state of an m-th factor (m=1, ..., M) corresponds to a state of an m-th appliance corresponding to the m-th factor. In a learning process of FHMM, model parameters are obtained or updated such that a synthetic waveform $Y_t$ at each time stamp t may be observed.

Assuming that hidden states $\{S_1, S_2, \ldots, S_t, \ldots, S_T\}$ correspond to observation data $\{Y_1, Y_2, \ldots, Y_t, \ldots, Y_T\}$, a joint probability $P(\{S_t, Y_t\})$ for a state $S_t$ and observation data $Y_t$ can be given as $$P(\{S_t, Y_t\}) = P(S_1)P(Y_1 \mid S_1)\prod_{t=2}^{T} P(S_t \mid S_{t-1})P(Y_t \mid S_t). \tag{1}$$

The joint probability $P(\{S_t, Y_t\})$ is a probability that $Y_t$ is observed in a state $S_t$ that is a combination of states of M factors.

$P(S_i)$ is an initial state probability that at initial time stamp t=1, a combination of states of M factors is in $S_1$. $P(S_1)$ can be calculated as $$P(S_1) = \prod_{m=1}^{M} P(S_1^{(m)}) \tag{2}$$

where $P(S^{(m)}_1)$ is an initial state probability that the state $S^{(m)}_1$ of the m-th factor is in the state at time stamp t=1.

$P(S_t \mid S_{t-1})$ is a transition probability (conditional probability) that a combination of states of M-factors: $S_{t-1}$ at time stamp t-1 transitions to a combination of states of M-factors: St at time stamp t. $P(S_t \mid S_{t-1})$ can be calculated as $$P(S_t \mid S_{t-1}) = \prod_{m=1}^{M} P(S_t^{(m)} \mid S_{t-1}^{(m)}) \tag{3}$$

A graphical representation for this model is illustrated in FIG. 10B. Assuming that the number of states is K, the transition probability $P(S^{(m)}_t \mid S^{(m)}_{t-1})$ is a K×K square matrix with a transition probability of the m-th factor from k-th state to k'-th (k'=1, 2, ...) state arranged in k-th row and k'-th column.

$P(Y_t \mid S_t)$ is an observation probability (conditional probability) that $Y_t$ is observed at time stamp t under the condition of a combination of states of M-factors being St.

$$P(\{S_t, Y_t\}) = |C|^{-1/2}(2\pi)^{-D/2}\exp\left\{-\frac{1}{2}(Y_t - \mu_t)'C^{-1}(Y_t - \mu_t)\right\}. \tag{4}$$

where $$\mu_t = \sum_{m=1}^{M} W^{(m)} S_t^{(m)} \tag{5}$$

D is a dimension of $Y_t$, C is a D×D covariance matrix, ' denotes matrix transpose, −1 denote inverse matrix, ‖ denote a determinant, and $W^{(m)}$ is a D×K weight matrix.

$W^{(m)}$ is a parameter relating of $P(\{S_t, Y_t\})$ corresponding to a waveform of m-th appliance. $\mu_t$ is an observation average at time t and is obtained by adding M column elements corresponding to the state $S^{(m)}_t$ of the matrix $W^{(m)}$.

In FHMM, an algorithm such as EM (Expectation-Maximization) algorithm may be used to estimate parameters from output (observation data) to maximize a log likelihood of observation data by repeating E (Expectation) step and M (Maximization) step as illustrated in a flow chart in FIG. 11. FIG. 11 illustrates a model learning procedure using EM algorithm.

<Step S1> Set initial parameters.

<Step S2> Acquire aggregate waveform data $\{Y_1, Y_2, \ldots, Y_T\}$.

<Step S3> Estimates state (calculate each probability that each factor of FHMM is in each state. That is, E step calculates an expectation value of likelihood of the model based on a distribution of latent variables currently estimated. The expectation value of the likelihood can be given as:

$$Q(\phi^{new}|\phi) = E\{\log P(\{S_t, Y_t\}|\phi^{new})|\phi, \{Y_t\}\} \qquad (6).$$

where Q is a function of parameters $\phi^{new}$, given current parameter $\phi$ and observation sequences $\{Y_t\}$. The model parameter estimated in FHMM, may be $\phi = \{W^{(m)}, \pi^{(m)}, P^{(m)}, C\}$, where $\pi^{(m)} = P(S^{(m)}_1)$ (initial state probability), $P^{(m)} = P(S^{(m)}_t|S^{(m)}_{t-1})$, and C and $W^{(m)}$ are those in the above equations (4) and (5).

<Step S4> M step maximizes Q as a function of $\phi^{new}$ The parameters obtained in the M step are used to determine a distribution of latent variables used in E step of next iteration.

<Step S5> Checks whether or not model parameter $\phi$ converges (does not increase). Steps 3 and 4 are repeated until the expected value converges (does not increase).

Complexity involved in selecting a state model structure (state transition model) for appliance(s) is relatively high in terms of the number of nodes and the number of edges in a state space graph of the state model.

Accordingly, instead of performing selection of a structure of a state model, the same structure of the state model, such as a fully connected state model, is kept used. The state model (model parameters) may be learned using data of different appliances, waveform of which are to be synthesized into an aggregate waveform.

However, keeping the same state model structure may lead to poor estimation accuracy in disaggregation, if given data obtained from an appliance and a state model structure do not match each other.

The fully connected state model is one of commonly used state model design in FHMM. Since the number of appliances in disaggregation varies in each application, it is difficult to select a structure (topology) of a state model. Therefore, selecting fully connected state model may be one of the options.

There are known such a method that learns a state model (parameters) automatically from given waveform data. This method may fall under a category of unsupervised learning approach and data driven models. However, it is known that this method cannot ensure that the state model structure selected is appropriate.

In Patent Literature 3 (PTL 3), there is disclosed an electrical power consumption measuring system that is capable of determining and presenting power consumed by individual appliances at a home or premises. The system collects operational state information about a plurality of appliances, each connected to a power line to which is also attached a power meter, and it can determine which appliances are on or off, and how much power each of the appliances consume.

Patent Literature 1: Japanese Patent Kokai Publication No. 2013-213825A

Patent Literature 2: Japanese Patent Kokai Publication No. 2013-218715A

Patent Literature 3: US2011/0112780A1

Non Patent Literature 1: Zoubin Ghahramani, and Michael I. Jordan, Factorial Hidden Markov Models', Machine Learning Volume 29, Issue 2-3, November/December 1997

SUMMARY

In related technologies of disaggregation, a structure of a fully connected state model does not always suit to all different kind of appliances.

Learning of state model based on an inappropriate state model structure from given waveform data would result in poor estimation accuracy. More specifically, using fully connected state models for all appliances in disaggregation system, complexity in estimation would be highly increased, which makes it difficult to estimate a state of the appliance.

The state model selection is very important to learn state model which would enable a estimation process in disaggregation to smoothly run.

The present invention is invented to solve the above problem and one of the objectives of the invention is to enable selection of an appropriate state model structure based on time series of sampled data of a signal with reduced complexity.

According to an aspect of the present invention, there is provided a state model structure selection apparatus comprising: an input unit that receives time series data from a data storage unit that stores time series of waveform sample data or feature values calculated from the sample data; a calculation unit that computes a measure indicating change and repetition characteristics of the time series data, based on sample value distribution thereof; and a selection unit that selects a state model structure to be used for model learning and estimation, from state models including a fully connected state model and a one way direction state model, based on the measure and stores the selected state model in a storage unit that stores the state model selected.

According to an aspect of the present invention, there is provided a disaggregation system comprising:

a data storage unit that stores time series of feature values of sample data;

a model storage unit that stores a state model;

a data acquisition unit that acquires waveform sample data of at least one appliance;

a data preprocessing unit that stores time series of feature values that is composed by the waveform sample data or calculated from the sample data;

a model structure selection unit that receives the time series data from the data storage unit, computes a measure indicating change and repetition characteristics of the time series data, based on sample value distribution of the time series data, and selects, a state model structure to be used for model learning and estimation, from state models including a fully connected state model and a one way direction state model, based on the measure to store the selected state model in the model storage unit;

a model learning unit that learns model parameters on the selected state model, from the waveform time series data acquired and stored in the data storage unit, using the selected state model stored in the model storage unit; and an estimation unit that estimates an individual waveform from a waveform into which respective individual waveforms of a plurality of appliances are aggregated, using the state model stored in the model storage unit.

According to an aspect of the present invention, there is provided a method for selecting a state model structure, comprising:

receiving time series data from a data storage unit that stores time series of waveform sample data or feature values calculated from the sample data;

computing a measure indicating change and repetition characteristics of the time series data, based on sample value distribution thereof received;

selecting a state model structure to be used for model learning and estimation, from state models including a fully connected state model and a one way direction state model, based on the measure; and storing the state model selected in a model storage unit.

According to an aspect of the present invention, there is provided a program causing a computer to execute processing comprising:

receiving time series data from a data storage unit that stores time series of waveform sample data or feature values calculated from the sample data;

computing a measure indicating change and repetition characteristics of the time series data, based on sample value distribution thereof received;

selecting a state model structure to be used for model learning and estimation, from state models including a fully connected state model and a one way direction state model, based on the measure; and storing the state model selected in a model storage unit.

In still another aspect of the present invention, there is provided a computer-readable recording medium (a non-transitory computer-readable recording medium such as a semiconductor memory (Random Access Memory (RAM), Read Only Memory (ROM), Electrically Erasable and Programmable Read Only Memory (EEPROM), flash memory, or the like), Hard Disk Drive (HDD), Solid State Drive (SSD), Compact Disc, Digital Versatile Disc, and so forth) which stores therein the program according to the above described aspect.

According to the present invention, it is possible to select an appropriate state model structure based on time series of sampled data of a signal with reduced complexity. As a result, the present invention can contribute to enhancement of accuracy in disaggregation. Still other features and advantages of the present invention will become readily apparent to those skilled in this art from the following detailed description in conjunction with the accompanying drawings wherein only exemplary embodiments of the invention are shown and described, simply by way of illustration of the best model contemplated of carrying out this invention. As will be realized, the invention is capable of other and different embodiments, and its several details are capable of modifications in various obvious aspects, all without departing from the invention. Accordingly, the drawing and description are to be regarded as illustrative in nature, and not as restrictive.

BRIEF DESCRIPTION OF DRAWINGS

FIG. 2A schematically illustrates a type 1 (fully connected) state model.

FIG. 2B shows a transition matrix of a type 1 (fully connected).

FIG. 2C schematically illustrates typical example of time series data of a type 1 (fully connected).

FIG. 3A schematically illustrates a type 2 (one way direction) state model.

FIG. 3B shows a transition matrix of a type 2 (one way direction).

FIG. 3C schematically illustrates typical example of time series data of a type 2 (one way direction).

DETAILED DESCRIPTION

Figure 1:
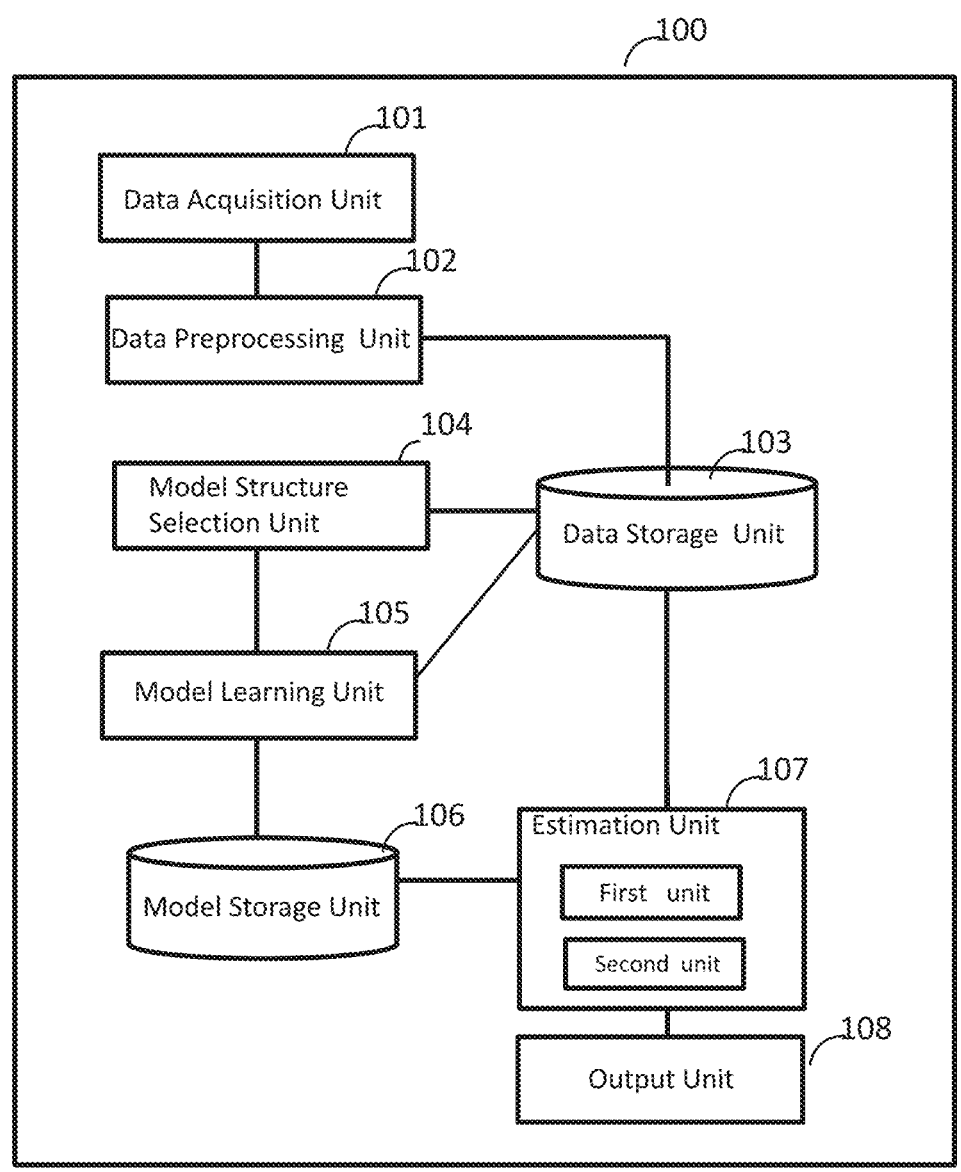
FIG. 1 is a diagram illustrating an arrangement of an example embodiment.

In one of example embodiments, a supervised learning approach is used to learn a state model (model parameters) from given waveform data of an appliance. It is noted that model selection means selecting a structure of the state model. In the example embodiments, it is assumed that FHMM model is used.

In one of the example embodiments, there may be provided two types of structures, wherein a first type is a fully connected state model and a second type is a one way direction state model, though not limited thereto. Out of these two types of state models, selection of a particular state model for given waveform data may be performed.

If a fully connected state model is assumed to be applied to all appliances in disaggregation system, then, there would be an increase in complexity of estimation to disaggregate an aggregate waveform of multiple appliances, such as total sum of current consumption thereof, into an individual signal waveform of each appliance. That is, using fully connected state model for all appliances in disaggregation would have such a disadvantage as an increase in complexity for estimating occurrence of a state at a relevant moment in the appliance from the aggregate waveform, such as current consumption waveform.

In one of example embodiments, a processor with a memory storing a program (instructions) therein may be configured to load and execute the program to execute: input processing that receives time series data from a data storage unit that stores time series of sample data or feature values calculated from the sample data; calculation processing that compute a measure indicating change and repetition characteristics of the time series data, based on sample value distribution thereof; and selection processing that selects a state model structure to be used for model learning and estimation, from state models including a fully connected state model and a one way direction state model, based on the measure and stores the selected state model in a storage unit that stores the state model selected. The state model selection out of fully connected state model and one way direction state model may be performed on a per appliance basis. For example, using combination of two types of state models, an appliance A may be assigned fully connected state model and an appliance B may assigned one way direction state model and so on, respectively, based on given waveform of each of appliance A and appliance B.

Assigning one of two state model structures on a per appliance basis can reduce complexity for estimating a waveform of each appliance in disaggregation that disaggregate an aggregate signal waveform of multiple appliances into a signal waveform of an individual appliance.

Waveform data such as current consumption (for example, RMS (root mean square) current) of an appliance includes mainly two types of patterns. Accordingly, it can be categorized into two types. For example, a first type is a step based pattern and the other is a repetition of same sequence. A step based pattern may include a pattern, such as a current consumption of an appliance, that takes a form similar to so called a step function or a staircase function, with horizontal line segments with jumps in-between. For example, a current consumption of an appliance is kept constant for a time period, in an appropriate measurement scale of current, and then changes instantly to jump to another value. In terms of state model structure, this means that a change of state occurs instantly and a state resides in its own state for some time period.

A second type is a sequence based pattern, in which a current consumption is not constant and changes frequently in response to operation and working of an appliance.

Example Embodiment 1

FIG. 1 is a diagram illustrating an arrangement of a disaggregation system according to a first example embodiment. The disaggregation system includes a data acquisition unit 101, a data preprocessing unit 102, a data storage unit 103, a model structure selection unit 104, a model learning unit 105, a model storage unit 106, an estimation unit 107, and an output unit 108.

The data acquisition unit 101 acquires waveform data (or aggregate waveform) of current measured at a main line or a power distribution board (not illustrated in the drawing) to which one or more appliances may be connected. The data acquisition unit 101 may acquire the waveform data (or aggregate waveform), via one or more communication networks, such as LAN (local area network) and/or WAN (wide area network), from a sensor (not illustrated in the drawing) that samples (measures) a signal and is equipped with a communication function, or from an energy management controller that acquires the waveform data (aggregate waveform).

The data preprocessing unit 102 calculates (extracts) features from the waveform data acquired by the data acquisition unit 101 and saves the calculated features in the data storage unit 103. For example, the data preprocessing unit 102 may calculate a root mean square (RMS), as a feature value, from the waveform data (i.e., sampled value of current signal). More specifically, the data preprocessing unit 102 may calculate time series of RMS values from current waveform data (instantaneous current value) sampled by a sensor at a predetermined sampling frequency. Alternatively, the sensor may provide time series data of such as RMS current that the sensor measures (calculates) to the data acquisition unit 101. Alternatively, the data preprocessing unit 102 may use as the feature value a peak value, an average value, a wave height value, etc. of the waveform in a time domain, or, the waveform itself in the time domain. The data preprocessing unit 102 may, if necessary, decimate or interpolate (re-sample) in time domain sample data of the waveform acquired by the data acquisition unit 101. Alternatively, the data preprocessing unit 102 may transform the waveform data using Fourier transform (Fast Fourier Transform (FFT) or Discrete Fourier Transform (DFT), etc.) into a frequency domain and may calculate a feature value based on frequency spectrum components. The sensor may provide time series data of magnitude of power (such as effective power) that the sensor measures to the data acquisition unit 101. In a still further variation, the data acquisition unit 101 may include the sensor to sample (measure) a signal waveform to obtain the time series data of the signal waveform or directly connected to the sensor.

Initially model training and state model learning may be executed to acquire appliance parameters into a probabilistic model that is a state model graph.

The model structure selection unit 104 selects a state model structure (fully connected state model or one way direction state model) from given waveform data stored in the data storage unit 103.

The selection of a state model structure by the model structure selection unit 104 may be executed prior to a model training phase.

When the training model structure of the state model is selected by the model structure selection unit 104, the model learning unit 105 may learn model parameter of the selected structure of the state model and store the trained model(s) for appliance(s) in the model storage unit 106.

The estimation unit 107 retrieves waveform information from the data storage unit 103 and estimates an individual waveform of each of appliances from an aggregate (synthetic) waveform data such as current consumption of a plurality of appliances.

The estimation unit 107 may use the above described EM algorithm, though not limited thereto. In this case, the estimation unit 107 may include a first unit that performs E-step and a second unit that performs M-step. The first unit (process), based on the waveform data $(Y_1, \ldots, Y_T)$ stored in the data storage unit 103, may estimate a state probability in each state of each factor (m) (m=1, . . . , M) of FHMM stored in the model storage unit 106, and supply a estimation result to the second unit. The second unit, using the acquired waveform data: $Y_1$ to $Y_T$ from the data storage unit 103 and the estimation result from the first unit, may perform learning of FHMM, and update the model parameter of FHMM: $\phi=\{W^{(m)}, \pi^{(m)}, P^{(m)}, C\}$, where $\pi^{(m)}$ is a initial state probability, $P^{(m)}$ is a transition probability, C is a covariance matrix, and $W^{(m)}$ is a characteristic waveform.

The output unit 108 outputs the estimation result (individual waveform of each of appliances) to an output device such as a display device, a storage device, or a network device (not illustrated in the drawing), wherein the network device may be configured to transmit the result to a remote terminal via a network (not illustrated in the drawing).

FIG. 2A illustrates an example of the fully connected state model, wherein four states, each with a self loop, are represented by four nodes in a directed graph (state transition diagram), the four nodes being connected by edges with each other. The self loop of each state is the edge connected to the node itself. Connection from each state to another state may be related to an analogy that the appliance in any state can change to another state without travelling a whole path. The self loop may be related to an analogy that the appliance keeps staying in its own state.

FIG. 2A may be represented by a 4×4 state transition matrix A, as illustrated in FIG. 2B, wherein $a_{i,j}$ element representing a state transition probability that i-th state $p_i$ transitions to j-th state $p_j$ (i,j=1 . . . , 4). It is noted that the number of states is not limited to 4, but can be increased, as per the requirement of the appliance working pattern and amount of current consumption for particular period of time.

As described above, a step based waveform data (time series data) as schematically illustrated in FIG. 2C can be suitable to the fully connected state model illustrated in FIG. 2A, where a self-loop in each state represents waiting at the same state until a next state occurs. In FIG. 2C, a horizontal axis indicates time and a vertical axis indicates a magnitude of a featured value, such as RMS (root mean square) current computed by the data preprocessing unit 102. That is, in FIG. 2C, a value at each of sampling points represented by a dot may be a magnitude of a feature value. It is as a matter of course possible to adopt as the time series data, a waveform data itself (instantaneously current value sampled by a current sensor), wherein an amplitude value of the sampled current value or an absolute value of the amplitude value may be used as a magnitude value.

FIG. 3A illustrates the one way direction state model, with K states (values): $p_1, \ldots, p_K$ and one waiting state w. The states in FIG. 3A are connected by one edge in one way direction. This means that transition from one state can be its next state. The topology is termed as one directional topology. State designated by w is a waiting state, in which a self-loop represents an occurrence of the same state, in which a probability of occurrence of the same state or a next state depends on a trained model.

A state transition matrix B with respect to states (values) $p_1$ to $p_K$ in FIG. 3A is illustrated in FIG. 3B. In a K×K matrix B, $b_{1,2}=b_{2,3}=b_{3,4}=b_{K-1,K}=1$, with remaining elements are all zero.

State transition probability P $(S_t|S_{t-1})$ for an appliance between states can be given as follows:

$$P(S_t=p_k|S_{t-1}=p_{k-1})=P(S_t=w|S_{t-1}=p_K)=1 \quad (7)$$

$$P(S_t=p_1|S_{t-1}=w)=\alpha \quad (8)$$

$$P(S_t=w|S_{t-1}=w)=1-\alpha \quad (9)$$

Equation (7) indicates that, when a value (operation state) of a state variable $S_{t-1}$ at time stamp t-1 is $p_{k-1}$, a probability that a value (state of operation) of a state variable $S_t$ at time stamp t transitions to $p_k$ is 1, for k=1 to K, and a probability that, when a value (operation state) of a state variable $S_{t-1}$ at time stamp t-1 is $p_K$, a value (state of operation) of a state variable $S_t$ at the next time stamp t transitions to w is 1.

Equation (8) indicates that the probability that the value (state of operation) of the state variable $S_t$ at time stamp t becomes $p_1$ is α (0<α<1), when a value (operation state) of the state variable $S_{t-1}$ at time stamp t-1 is w (waiting state).

Equation (9) indicates that the probability that a value (state of operation) of the state variable $S_t$ at time stamp t is w (Waiting state) is 1-α, when a value (operation state) of the state variable $S_{t-1}$ at time stamp t-1 is w (wait state).

The state variables $S_t$ and $S_{t-1}$ in Equations (7)-(9) may be associated with an individual appliance composing a plurality of appliances whose waveforms are aggregated into an aggregate waveform data. That is, $S_t$ and $S_{t-1}$ in Equations (7)-(9) of the one way direction state model may be associated with states of a m-th factor (m-th appliance) $S^{(m)}_t$ and $S^{(m)}_{t-1}$ out of total M factors (M appliances), at time stamp t and t-1, in model learning process by the model learning unit 105, after the one way direction state model is selected by the model structure selection unit 104.

As described above, the one way direction state model represents the sequence of patterns in the appliance, as illustrated in FIG. 3C. The repetition of sequences is analogous to design one connection between states. Since sequences of pattern are repeating, there is a waiting time or a pause time in-between sequences of appliances. The waiting time can be mapped to a waiting state of the state model structure. A length of one way states can be changed based on the sequence or pattern of the appliance. In FIG. 3C, as with FIG. 2C, a horizontal axis indicates time and a vertical axis indicates a magnitude of a feature value such as RMS current computed by the data preprocessing unit 102.

Figure 4:
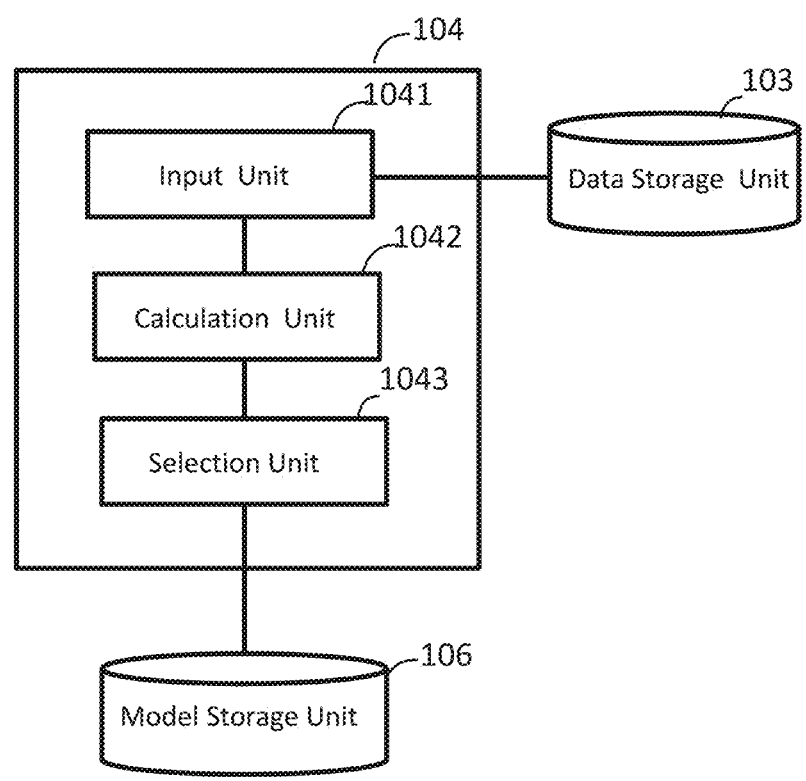
FIG. 4 schematically illustrates a model structure selection unit.

FIG. 4 illustrates a model selection unit 104. Referring to FIG. 4, the model selection unit 104 includes an input unit 1041 that receives waveform time series data from the data storage unit 103, a calculation unit 1042 that computes a measure indicating change and repetition characteristics of the waveform time series data, based on each sample value (such as magnitude or amplitude) distribution thereof received, a selection unit 1043 that selects a state model structure to be used for model learning and estimation from a fully connected state model and a one way direction state model, for example, based on the measure, and stores the selected state model in the model storage unit 106.

Figure 5:
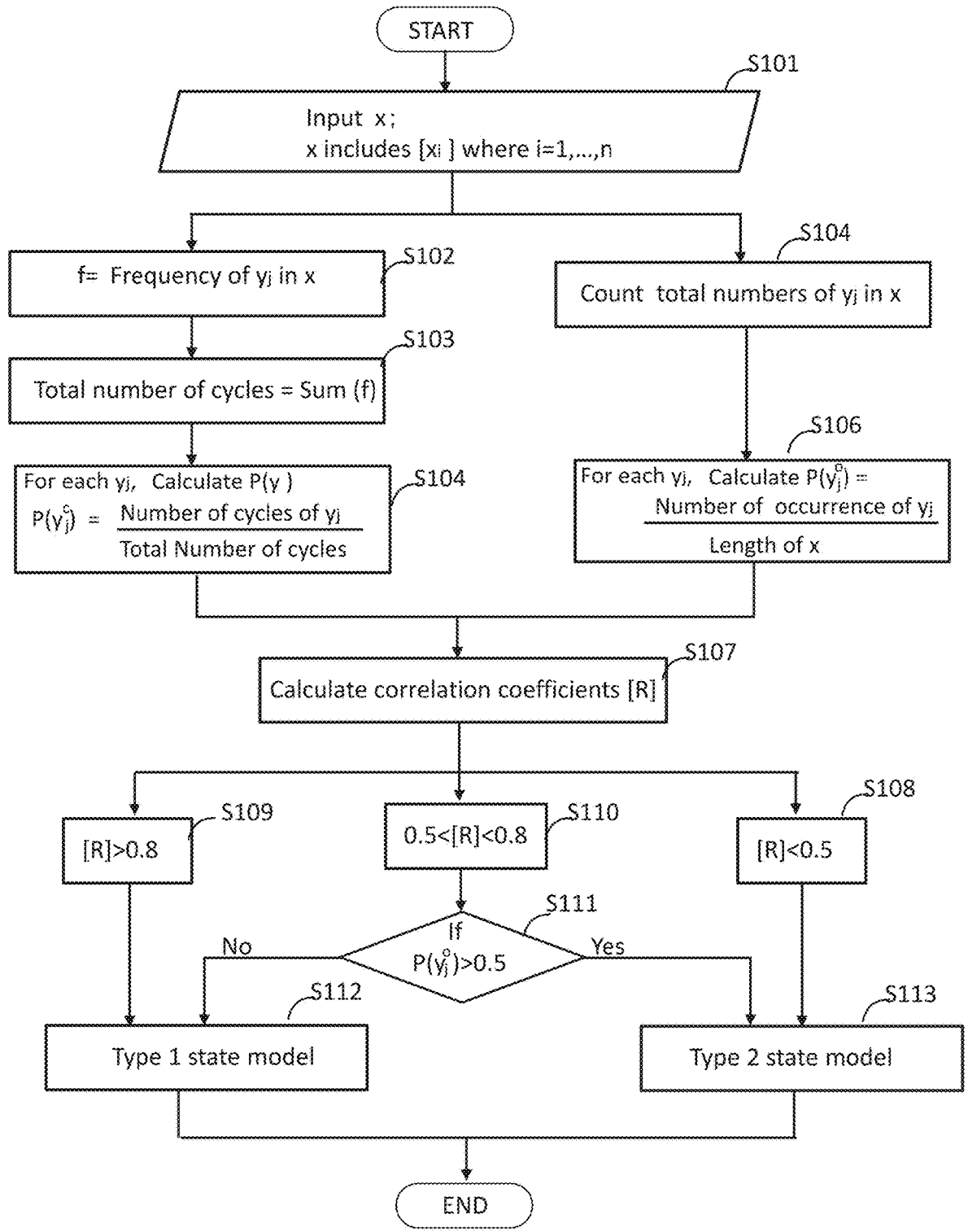
FIG. 5 is a flow chart illustrating procedures of an example embodiment.

FIG. 5 is a flow chart illustrating an operation of the model structure selection unit 104.

The following describes procedures for selecting a state model structure based on two types of state model structures with two examples of time series data.

<Step S101>

Input from the data storage unit 103, a waveform time series data x including $[x_i]$, where i=1,2, . . . , n. In this example, though not limited there to, each sample $x_i$ (i=1, . . . , n) may be a magnitude of a root mean square (RMS) current value calculated by the data preprocessing unit 102 from the current waveform data acquired by the data acquisition unit 101. The RMS current value may be obtained from a current sensor. Or, each sample $x_i$ (i=1, . . . , n) may be a magnitude of a feature value other than a RMS that is calculated by the data preprocessing unit 102. Alternatively, each sample xi (i=1, . . . ,n) may be an amplitude (or absolute value of an amplitude) of sample data of the waveform data acquired by the data acquisition unit 101.

Figure 6A:
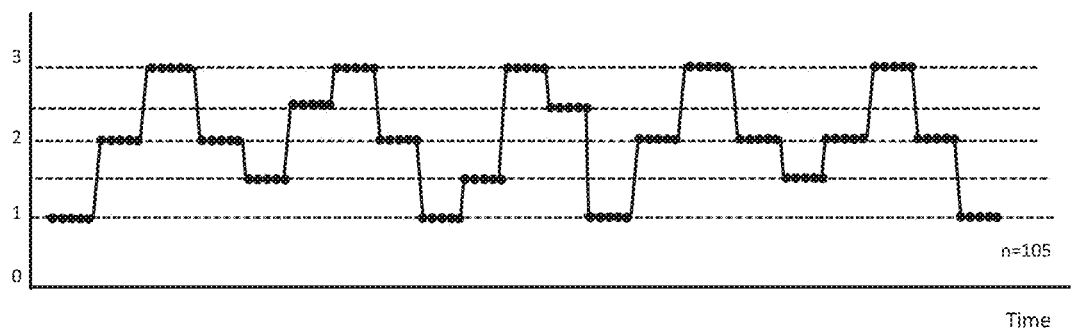
FIG. 6A schematically illustrates time series data of an example case of type 1 state model structure.

In an example of FIG. 6A, the time series data x includes sample data set: $x_i$, where i=1,2, . . . , n(=105). In an example of FIG. 7A, the time series data x includes sample data $x_i$, where i=1,2, . . . , n(=45).

Figure 7A:
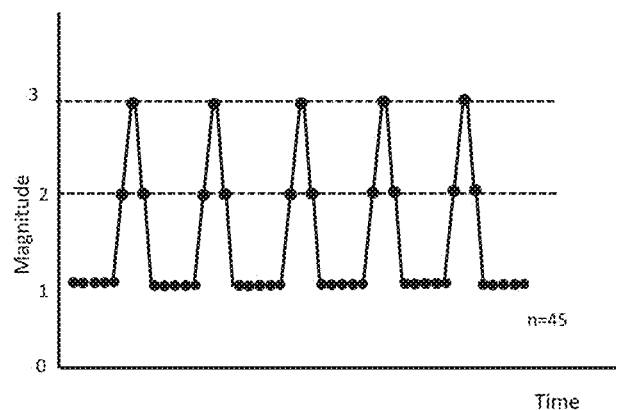
FIG. 7A schematically illustrates time series data of an example case of type 2 state model structure.

In FIG. 6A and FIG. 7A, a horizontal axis is a time and a vertical axis is a magnitude of each sample of the time series data x. More specifically, a magnitude may refer to an absolute value (magnitude) of each sample or a magnitude of each RMS sample of the time series data x.

It is noted that assuming that appliances whose current are aggregated into an aggregate waveform are an appliance A and an appliance B, the time series waveform data of FIG. 6A may be obtained from the appliance A alone in operation, with the appliance B being stopped, and the time series waveform data of FIG. 7A may be obtained from the appliance B alone in operation, with the appliance A being stopped.

<Step S102>

Calculate a frequency of occurrence of a sampled value data of the time series data x.

Figure 6B:
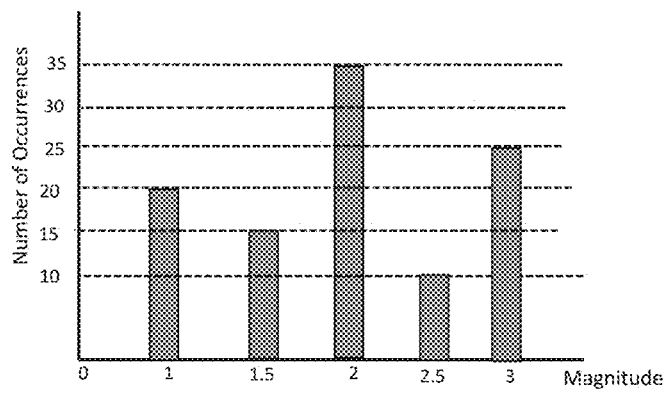
FIG. 6B illustrates Number of Occurrences of Magnitude of FIG. 6A.

FIG. 6B illustrates magnitude value (horizontal axis) vs. number of occurrences of that magnitude value (vertical axis) in the time series data of FIG. 6A. The time series data $x=[x_i]$ (i=1, ..., 105) has five different magnitude values $(y_1-y_5)$: 1, 1.5, 2, 2.5 and 3. Occurrence of magnitude values: 1, 1.5, 2, 2.5 and 3 are 20, 15, 35, 10 and 25, respectively.

As shown in FIG. 6A, frequency of amplitude values: $1(=y_1)$ is 4, frequency of amplitude values: $1.5(=y_2)$ is 3, frequency of amplitude values: $2(=y_3)$ is 7, frequency of amplitude values: $2.5(=y_4)$ is 2, and frequency of amplitude values: $3 (=y_5)$ is 5.

Figure 7B:
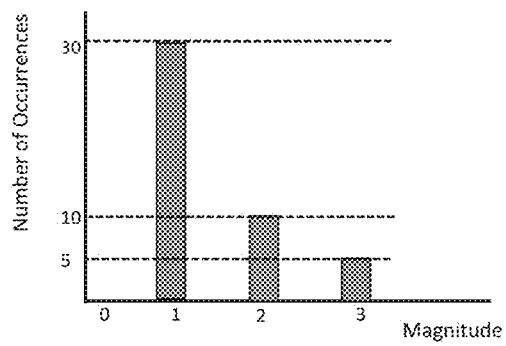
FIG. 7B illustrates Number of Occurrences of Magnitude of FIG. 7A.

FIG. 7B illustrates magnitude (horizontal axis) vs. number of occurrences of magnitude value (vertical axis) in time series data of FIG. 7A. The time series data $x=[x_i]$ (i=1, ..., 45) has three different magnitude values $(y_1-y_3)$: 1, 2, 3. Occurrence of magnitude values 1, 2, and 3 are 30, 10, and 5, respectively.

As shown in FIG. 7A, frequency of a first magnitude value: $1(=y_1)$ is 6, frequency of a second magnitude value: $2(=y_2)$ is 10, and frequency of a third magnitude value: $3 (=y_3)$ is 5.

<Step S103>

The total number of cycles is counted.

In the case of FIG. 6A, total number of cycles=4+3+7+2+5=21.

In the case of FIG. 7A, total number of cycles=6+10+5=21.

<Step S104>

A probability of number of cycles for magnitude value: $y_j$ is calculated by dividing an occurrence of number of cycles of $y_j$ by total number of cycles.

$$P(y_j^c) = \frac{\text{Number of cycles of } y_j}{\text{Total number of cycles}} \quad (10)$$

In the case of FIG. 6A, the probabilities are given, for $y_1=1$, $y_2=1.5$, $y_3=2$, $y_4=2.5$, and $y_{5=3}$, as follows:

$P(y_1^c)$=4/21=0.190, $P(y_2^c)$=3/21=0.143, $P(y_3^c)$=7/21=0.333, $P(y_4^c)$=2/21=0.095 and $P(y_3^c)$=5/21=0.238.

In the case of FIG. 7A, the probabilities are given, for $y_1=1$, $y_2=2$, and $y_3=3$, as follows:

$P(y_1^c)$=6/21=0.285, $P(y_2^c)$=10/21=0.476, and $P(y_3^c)$=5/21=0.238.

<Step S105>

The number of times $y_j$ in the time series data x is counted.

In the case of FIG. 6A, the total number of amplitude value: $y_1$, $y_2$, $y_3$ $y_4$, and $y_5$ are respectively 20, 15, 35, 10 and 25.

In the case of FIG. 7A, the total number of amplitude value: $y_2$, and $y_3$ are respectively 30, 10, and 5.

<Step S106>

A probability of number of occurrences of $y_j$, is calculated by dividing Number of occurrences of magnitude value: $y_j$ by length of x.

$$P(y_j^o) = \frac{\text{Number of occurences of } y_j}{\text{Lentgh of } x} \quad (11)$$

In the case of FIG. 6A, the probabilities are given, for $y_1=1$, $y_2=1.5$, $y_3=2$, $y_4=2.5$, and $y_5=3$, as follows:

$P(y_1^o)$=20/105=0.190, $P(y_2^o)$=15/105=0.143, $P(y_3^o)$=35/105=0.333, $P(y_4^o)$=10/105=0.095, and $P(y_5^o)$=25/105=0.238.

In the case of FIG. 7A, the probabilities are given, for $y_1=1$, $y_2=2$, and $y_3=3$, as follows:

$P(y_1^o)$=30/45=0.667, $P(y_2^o)$=10/45=0.222, and)

$P(y_3^o)$=5/45=0.111.

<Step S107>

A correlation coefficient [R] between the probability of number of cycles and the probability of number of occurrences of $y_j$ is calculated.

Figure 6C:
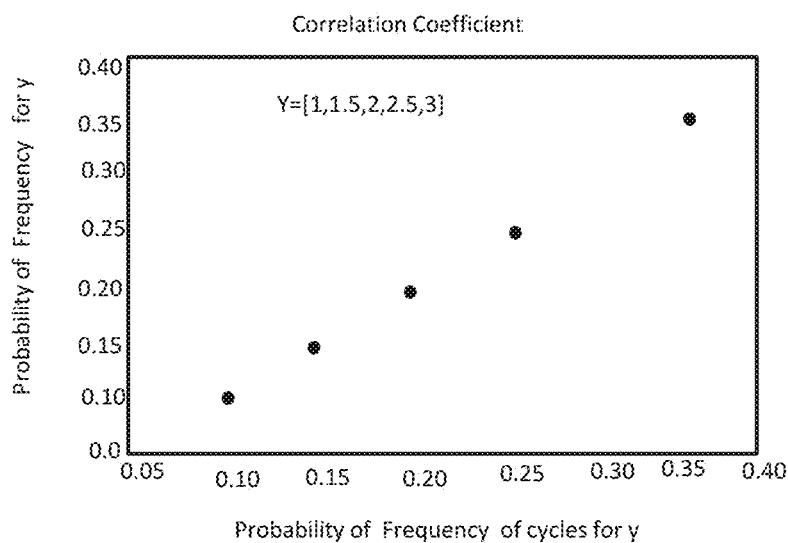
FIG. 6C illustrates Correlation Coefficient between Probability of Frequency of cycles and Probability of Frequency in FIG. 6A.

FIG. 6C shows a scatter map or correlation [R] between the probability of number of cycles and the probability of number of occurrences of magnitude value: $y_j$ (j=1, ..., 5). A horizontal axis indicates the probability of number of occurrences of $y_j$ and a vertical axis indicates the probability of number of cycles of $y_j$. It is observed in FIG. 6C that there is strong correlation between the probability of number of cycles and probability of number of occurrences of $y_j$.

Figure 7C:
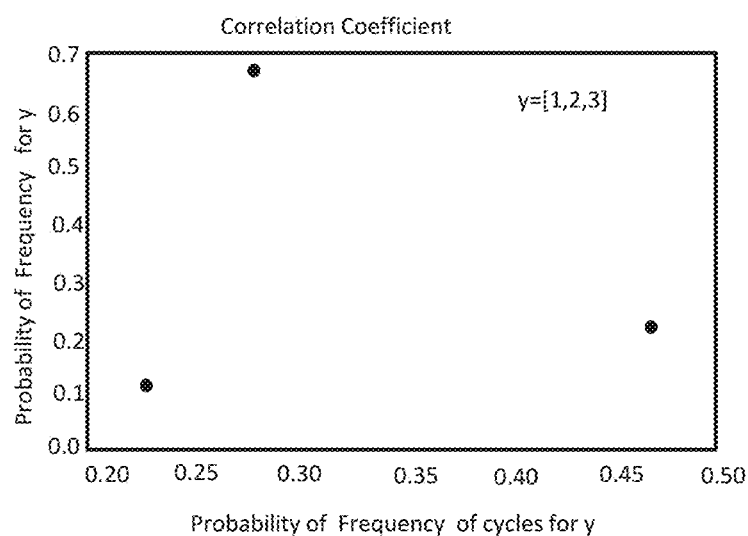
FIG. 7C illustrates Correlation Coefficient between Probability of Frequency of cycles and Probability of Frequency in FIG. 7A.

FIG. 7C shows a scatter map or correlation [R] between probability of number of cycles and probability of number of occurrences of magnitude value: $y_j$ (j=1,2, and 3). It is observed in FIG. 7C that there is no correlation between the probability of number of cycles and the probability of number of occurrences of $y_j$.

<Step S108>

In a case where the correlation coefficient is less than 0.5, a type 2 state model structure is selected (Step S113).

<Step S109>

In a case where the correlation coefficient is greater than 0.8, a type 1 state model structure is selected (Step S112).

<Step S110>

In a case where the correlation coefficient is less than or equal to 0.8 and greater than or equal to 0.5, check if the probability of number of occurrences of $y_j$ is greater than 0.5 (Step S111).

If the probability of number of occurrences of $y_j$ is greater than 0.5, the type 2 state model structure is selected (Step S113).

If the probability of number of occurrences of $y_j$ is less than or equal to 0.5, the type 1 state model structure is selected (Step S112).

The type 1 state model is a fully connected state model as illustrated in FIG. 2A, and the type 2 state model is a one way direction state model, as illustrated in FIG. 3A.

The two types of state model structures are selected and assigned to appliances on a per appliance basis.

The selection method selects a state model structure with the concept of occurrence of $y_j$ and the number cycles of $y_j$. The correlation coefficient is used to find relationship between these two variables.

The correlation coefficient [R] between 0 and 0.5 is a weak correlation between two given variables.

The type 2 state model structure is selected for this kind of relation (weak correlation) between the probability of number of cycles and the probability of number of occurrences of $y_j$. The reason for this is that repetition of the same sequence in given data will have the same $y_j$ repeating after each time period. The correlation between the two variables being less than 0.5 may be used as a threshold value to select the type 2 state model structure.

Secondly, a moderate correlation [R] between the two variables lies in between 0.5 and 0.8. When the correlation coefficient [R] between the probability of number of cycles and the probability of number of occurrences of $y_j$ lies in this range, the probability of occurrence of $y_j$ is further examined as one extra step (Step S111 in FIG. 5). The given waveform does not clearly fall under type 1 and type 2 structures, and one more examination (Step S111 in FIG. 5) is required.

The probability of occurrence of any $y_j$ being greater than 0.5 will lead to final selection of the type 2 state model structure.

The reason of adopting 0.5 as a threshold for probability of occurrence of $y_j$ is that if a state is occurring more than 50% of time from the total time period, then it is clear that the structure of one way direction will be suited better to the given waveform data. If the probability of occurrence of $y_j$ is greater than 0.5, then, in terms of state model approach, the number of occurrences of one state is more than 50% of the total length (total time period) of the sampled waveform data length.

In order to reduce complexity, by assigning the type 2 state model structure to this kind of waveform data (time series data), it is better to assign a single state, such as w in FIG. 3A that is a waiting state, to such a kind of state that occurs more than 50% of the total length (total time period) of the time series data length. The single state (w in FIG. 3A) can make transition to a leading state $p_1$ of the type 2 state model structure.

The type 1 model structure will not have a probability 0.5 of occurring the same state as many times, because the full connected topology has many paths which can be chosen from one state and each $y_j$ will share approximately the same probability of occurrence of $y_j$.

Example Embodiment 2

Figure 8:
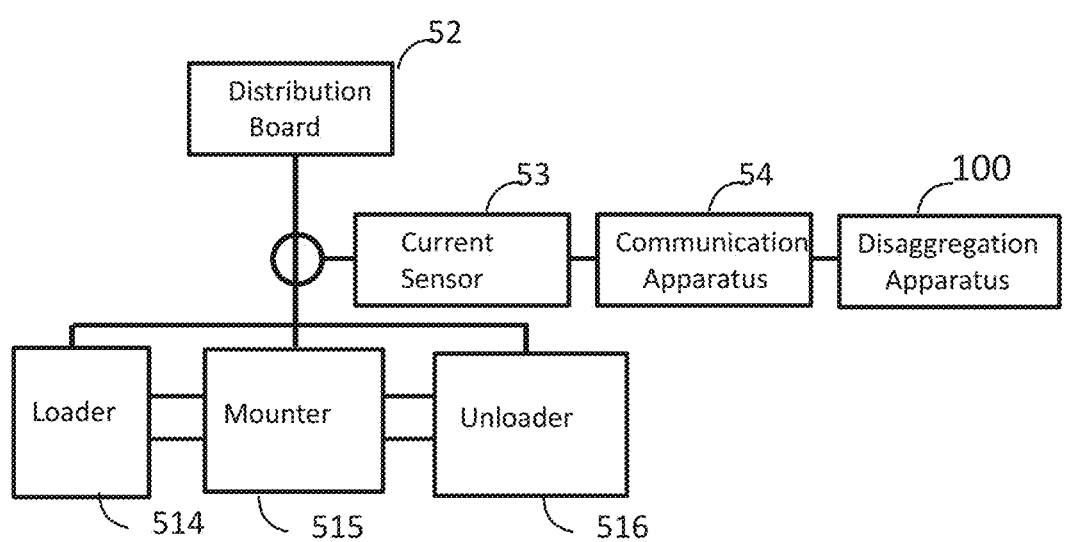
FIG. 8 schematically illustrates a system of a second example embodiment.

FIG. 8 schematically illustrates Example Embodiment 2 in which the present invention is applied to a production system. Although not particularly limited, in the first exemplary embodiment, the application to a surface mounting system of an electronic substrate is described as a production system. Referring to FIG. 8, a loader (substrate supply apparatus) 514 sets the substrate on which cream solder has been printed in a rack, and automatically supplies the set substrate to a mounter 515. The mounter 515 automatically mounts electronic components on the board. An unloader 516 automatically stores the mounted board in the rack. A substrate transfer conveyor 514 transports the substrate provided in a series from the loader 514 to the mounter 515 and the unloader 516. The substrate stored in the rack by the unloader 516 is further transported to a subsequent process such as a reflow process, an inspection process, an assembly packing process and the like (not illustrated in the drawing).

A current sensor 53 measures a current at a power distribution line from a distribution board 52 to the loader 514, mounter 515 and the unloader 516, wherein the current is a sum of current supplied to the loader 514, the mounter 515 and the unloader 516, for example. The current sensor 53 transmits the measured current waveform (digital signal waveform) to the waveform disaggregation apparatus 100 via the communication device 54. The current sensor 53 may be constituted by a CT (Current Transformer) (for example, a zero-phase-sequence current transformer (ZCT)), a Hall element or the like. The current sensor 53 may sample a current waveform (analog waveform) with an analog-to-digital converter (not shown), converts it into a digital signal waveform, compresses and encodes it with an encoder (not shown), and then supplies the signal to the communication apparatus 54 as W-SUN (Wireless Smart Utility Network) or the like. The current sensor 53 may calculate RMS(root mean square) current from instantaneously current values sampled at predetermined sampling frequency and transmit time series data of RMS current to the waveform disaggregation apparatus 100 via the communication device 54. The communication apparatus 54 may be disposed in a factory (building). We have found that the one way direction state model can well be applied as a state model structure for the mounter 515.

The disaggregation apparatus 100 may be disposed in a factory or may be mounted on a cloud server connected to the communication device 54 via a wide area network such as the Internet.

The disaggregation apparatus 100 may select as the state model structure for the mounter 515, the one way direction state model as illustrated in FIG. 3A, wherein "w" (waiting state) indicates that the mounter 515 is waiting for pre and post process (waiting for an arrival of a substrate to be processed from a previous process, or waiting for unloading a substrate on which the mounting process is finished, to a subsequent process). Regarding the mounter 515, the time required for circulation from the waiting state w through states $p_1$ to $p_K$ and returning to the waiting state w, in FIG. 3A, is referred to as a cycle time.

Example Embodiment 3

Figure 9:
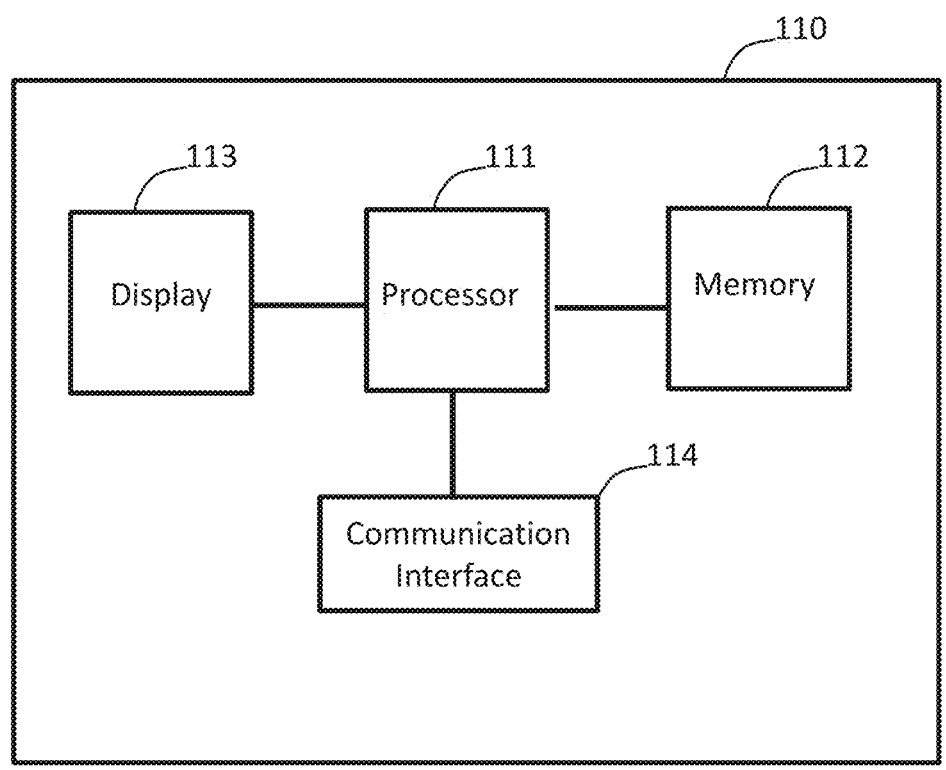
FIG. 9 schematically illustrates a system of a third example embodiment.
Figure 10A:
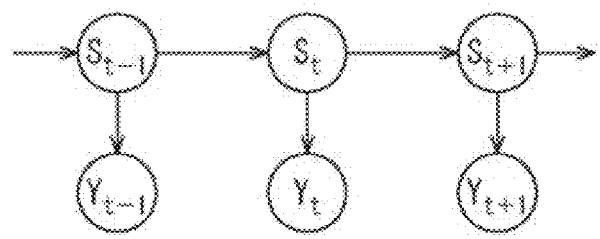
FIG. 10A schematically illustrates graphical model of HMM in terms of relation between observation and states thereof.
Figure 10B:
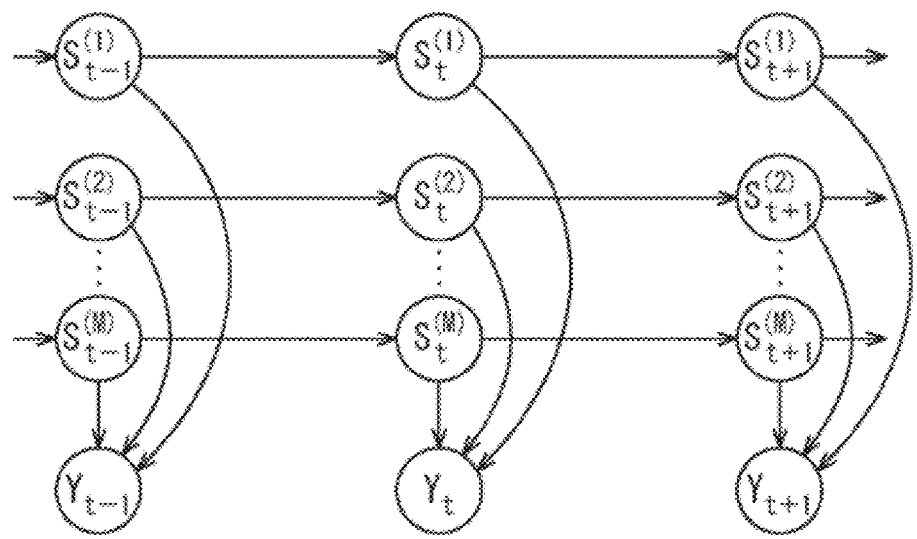
FIG. 10B schematically illustrates graphical model of FMMM in terms of relation between observation and states thereof.
Figure 11:
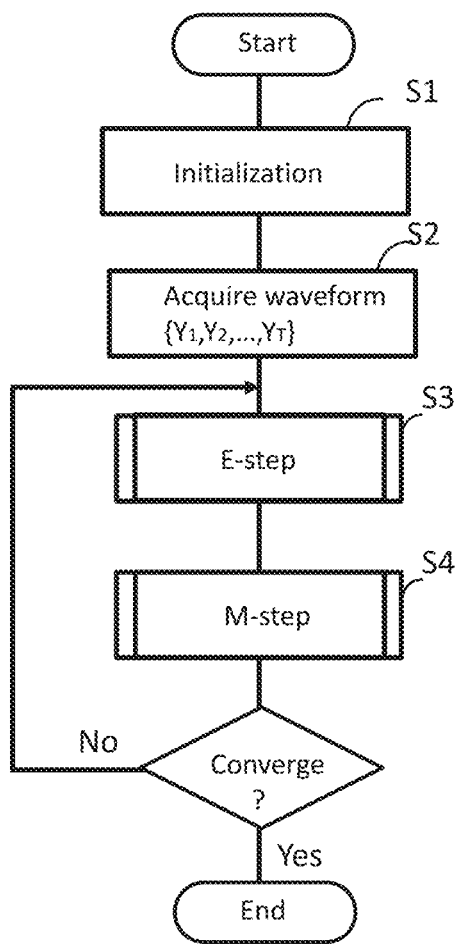
FIG. 11 schematically illustrates disaggregation procedure using EM algorithm.

The disaggregation system or apparatus described in the above embodiments may be implemented on a computer system as illustrated in FIG. 9, for example. Referring to FIG. 9, a computer system 110, such as a server system, includes a processor (Central Processing Unit) 111, a memory 112 including, for example, a semiconductor memory (for example, Random Access Memory (RAM), Read Only Memory (ROM), Electrically Erasable and Programmable ROM (EEPROM), and/or a storage device including at least one of Hard Disk Drive (HDD), Compact Disc (CD), Digital Versatile Disc (DVD) and so forth, a display device 113, and a communication interface 114. The communication interface 114 (such as a network interface controller (NIC)) may well be configured to communicate with a current sensor or a controller of an energy management system such as FEMS (Factory Energy Management System) via LAN and/or WAN, for example. A program for executing the process of the disaggregation system in FIG. 1 is stored in a memory 112 and the processor 111 reads the program from the memory to execute the program to realize the disaggregation system.

The disclosure of the aforementioned PTLs 1-3 and NPL 1 is incorporated by reference herein. The particular exemplary embodiments or examples may be modified or adjusted within the scope of the entire disclosure of the present invention, inclusive of claims, based on the fundamental technical concept of the invention. In addition, a variety of combinations or selections of elements disclosed herein may be used within the concept of the claims. That is, the present invention may encompass a wide variety of modifications or corrections that may occur to those skilled in the art in accordance with the entire disclosure of the present invention, inclusive of claims and the technical concept of the present invention.

What is claimed is:

1. A state model structure selection apparatus comprising:
a processor; and
a memory storing program instructions executable by the processor is configured to execute the program instructions stored in the memory to
receive time series data from a data storage unit that stores time series of sample data or feature values calculated from the sample data;
compute a measure indicating change and repetition characteristics of the time series data, based on sample value distribution thereof; and
select a state model structure to be used for model learning and estimation, from state models including a fully connected state model and a one way direction state model, based on the measure and stores the selected state model in a storage unit that stores the state model selected, wherein the processor is configured to compute:
a first probability of number of cycles for each magnitude value in the time series data, by dividing number of cycles of the magnitude value by total number of cycles in the time series data; and
a second probability of number of occurrences for each magnitude value in the time series data, by dividing number of occurrences of the magnitude value by a length of the time series data;
compute a correlation coefficient between the first probability and the second probability, and
select either the fully connected state model or the one way direction state model, based on the correlation coefficient, as the measure.

2. The state model structure selection apparatus according to claim 1, wherein the processor is configured to execute the program instructions stored in the memory to select the fully connected state model when the correlation coefficient is more than a first threshold value, and select the one way direction state model when the correlation coefficient is less than a second threshold value that is less than the first threshold value.

3. The state model structure selection apparatus according to claim 2, wherein, the processor is configured to execute the program instructions stored in the memory to,
when the correlation coefficient is between the second threshold value and the first threshold value,
check whether or not the second probability is more than a third threshold value, and
select the fully connected state model, when the second probability is less than or equal to the third threshold value, and select the one way direction state model when the correlation coefficient is more than a third threshold value.

4. The state model structure selection apparatus according to claim 3, wherein the third threshold value is equal to the second threshold value.

5. The state model structure selection apparatus according to claim 1, wherein the feature value includes a root mean square (RMS) value of a current signal.

6. A computer based method for selecting a state model structure, comprising:
receiving time series data from a data storage unit that stores time series of sample data or feature values calculated from the sample data;
computing a measure indicating change and repetition characteristics of the time series data, based on sample value distribution thereof received;
selecting a state model structure to be used for model learning and estimation, from state models including a fully connected state model and a one way direction state model, based on the measure; and
storing the state model selected in a model storage unit, the method further comprising:
computing a first probability of number of cycles for each magnitude value in the time series data, by dividing number of cycles of the magnitude value by total number of cycles in the time series data;
computing a second probability of number of occurrences for each magnitude value in the time series data, by dividing number of occurrences of the value by a length of the time series data;
computing a correlation coefficient between the first probability and the second probability; and
selecting either the fully connected state model or the one way direction state model, based on the correlation coefficient, as the measure.

7. The computer based method according to claim 6, comprising
selecting the fully connected state model when the correlation coefficient is more than a first threshold value, while selecting the one way direction state model when the correlation coefficient is less than a second threshold value that is less than the first threshold value.

8. The computer based method according to claim 7, comprising:
checking, whether or not the second probability is more than a third threshold value, when the correlation coefficient is between the second threshold value and the first threshold value; and
selecting the fully connected state model, when the second probability is less than or equal to the third threshold value, while selecting the one way direction state model, when the correlation coefficient is more than a third threshold value.

9. The method according to claim 8, wherein the third threshold value is equal to the second threshold value.

10. The method according to claim 6, wherein the feature value includes a root mean square (RMS) of a current signal.

11. A non-transitory computer-readable medium storing a program causing a computer to execute processing comprising:
receiving time series data from a data storage unit that stores time series of sample data or feature values calculated from the sample data;
computing a measure indicating change and repetition characteristics of the time series data, based on sample value distribution thereof received;
selecting a state model structure to be used for model learning and estimation, from state models including a fully connected state model and a one way direction state model, based on the measure; and storing the state model selected in a model storage unit, the processing further comprising:

computing a first probability of number of cycles for each magnitude value in the time series data, by dividing number of cycles of the magnitude value by total number of cycles in the time series data;

computing a second probability of number of occurrences for each magnitude value in the time series data, by dividing number of occurrences of the value by a length of the time series data;

computing a correlation coefficient between the first probability and the second probability; and selecting either the fully connected state model or the one way direction state model, based on the correlation coefficient, as the measure.

* * * * *